United States Patent
Okamoto et al.

(10) Patent No.: US 9,997,736 B2
(45) Date of Patent: Jun. 12, 2018

(54) ORGANIC EL DEVICE

(71) Applicant: Sharp Kabushiki Kaisha, Sakai, Osaka (JP)

(72) Inventors: Tetsuya Okamoto, Sakai (JP); Takeshi Hirase, Sakai (JP); Tohru Senoo, Sakai (JP); Tohru Sonoda, Sakai (JP); Seiji Fujiwara, Sakai (JP); Daichi Nishikawa, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days. days.

(21) Appl. No.: 15/536,511

(22) PCT Filed: Dec. 9, 2015

(86) PCT No.: PCT/JP2015/084503
§ 371 (c)(1),
(2) Date: Jun. 15, 2017

(87) PCT Pub. No.: WO2016/098655
PCT Pub. Date: Jun. 23, 2016

(65) Prior Publication Data
US 2017/0352832 A1    Dec. 7, 2017

(30) Foreign Application Priority Data
Dec. 15, 2014  (JP) .................. 2014-252727

(51) Int. Cl.
| | |
|---|---|
| *H01L 35/24* | (2006.01) |
| *H01L 51/00* | (2006.01) |
| *H01L 51/52* | (2006.01) |
| *H01L 27/32* | (2006.01) |
| *H01L 51/50* | (2006.01) |

(52) U.S. Cl.
CPC ...... *H01L 51/5246* (2013.01); *H01L 27/3244* (2013.01); *H01L 51/5012* (2013.01); *H01L 51/5206* (2013.01); *H01L 51/5221* (2013.01)

(58) Field of Classification Search
CPC ............ H01L 51/5246; H01L 51/5012; H01L 27/3244
USPC ......................................................... 257/40
See application file for complete search history.

(56) References Cited

U.S. PATENT DOCUMENTS

| | | |
|---|---|---|
| 9,013,099 B2 | 4/2015 | Wang et al. |
| 2003/0183830 A1 | 10/2003 | Yamazaki et al. |
| 2005/0285522 A1 | 12/2005 | Han et al. |
| 2007/0210702 A1 | 9/2007 | Nakamura |
| 2012/0206036 A1 | 8/2012 | Tanaka et al. |

(Continued)

FOREIGN PATENT DOCUMENTS

| | | |
|---|---|---|
| CN | 102664239 A | 9/2012 |
| JP | 2006-004909 A | 1/2006 |

(Continued)

*Primary Examiner* — David S Blum
(74) *Attorney, Agent, or Firm* — ScienBiziP, P.C.

(57) ABSTRACT

An organic EL device includes a TFT substrate 1, a first electrode 5 provided on the TFT substrate 1, an organic EL layer 6 provided on the first electrode 5, a second electrode 7 provided on the organic EL layer 6, and a sealing film 10 covering the second electrode 7. The TFT substrate 1 is provided thereon with upward projections 11 and 12. The upward projections 11 and 12 are covered with the sealing film 10.

20 Claims, 7 Drawing Sheets

(56) References Cited

U.S. PATENT DOCUMENTS

2013/0334959 A1* 12/2013 Wang .................. H01L 51/5256
                                                          313/512
2014/0319474 A1    10/2014 Kim et al.

FOREIGN PATENT DOCUMENTS

| JP | 2008010233 A | 1/2008 |
| JP | 2008153004 A | 7/2008 |
| JP | 2012114093 A | 6/2012 |
| JP | 2012186153 A | 9/2012 |
| JP | 2013069701 A | 4/2013 |
| WO | 2009104563 A | 8/2009 |

* cited by examiner

ORGANIC EL DEVICE

TECHNICAL FIELD

The present invention relates to an organic EL device.

BACKGROUND ART

An organic electro luminescence (EL) element has problems including generation and development of a nonluminescent portion due to dark spots, shrinks, and the like during long-time drive, leading to deterioration in performance of an organic EL device including the organic EL element. Generation of such dark spots and shrinks will be influenced largely by moisture of vapor and the like and oxygen.

In view of this, there has been known a configuration including a sealing film covering an organic EL element to prevent entry of moisture and oxygen (see Patent Literature 1).

CITATION LIST

Patent Literature

Patent Literature 1: JP 2008-153004 A

SUMMARY OF INVENTION

Technical Problem

A film having a high barrier property and applied as a sealing film is typically desired to have high density. Such a film tends to be hard and weak as well as have high membrane stress, to possibly cause separation from an end portion of the sealing film.

It is an object of the present invention to provide a technique of inhibiting separation from an end portion of a sealing film included in an organic EL device.

Solution to Problem

An organic EL device according to an embodiment of the present invention includes: a substrate; a first electrode provided on the substrate; an organic EL layer provided on the first electrode; a second electrode provided on the organic EL layer; and a sealing film covering the second electrode; in which the substrate is provided thereon with at least one upward projection, and the sealing film covers the projection.

Advantageous Effect of Invention

The present invention achieves increase in contact area at an end portion of the sealing film to inhibit separation of the sealing film.

DESCRIPTION OF EMBODIMENTS

Figure 1:
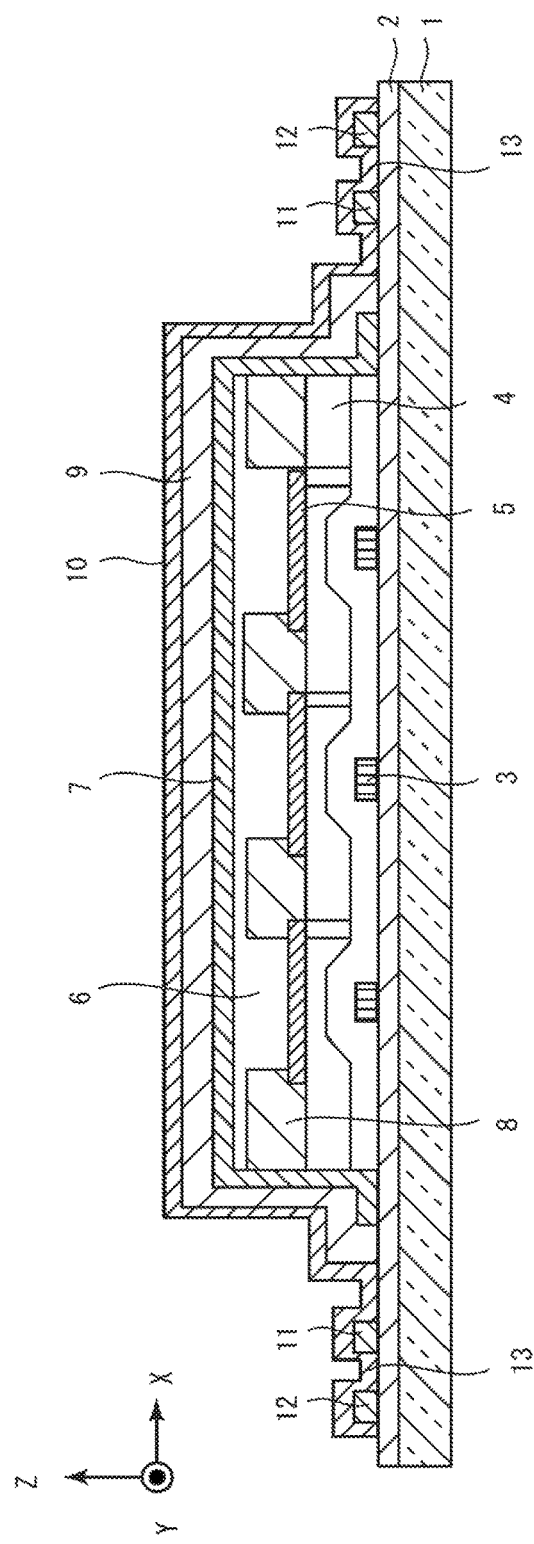
FIG. 1 is a schematic sectional view of an organic EL display device according to a first embodiment.

An organic EL device according to an embodiment of the present invention includes: a substrate; a first electrode provided on the substrate; an organic EL layer provided on the first electrode; a second electrode provided on the organic EL layer; and a sealing film covering the second electrode; in which the substrate is provided thereon with at least one upward projection, and the sealing film covers the projection (a first configuration).

The first configuration achieves increase in contact area at an end portion of the sealing film to inhibit separation of the sealing film, in comparison to a configuration provided with no projection.

In the first configuration, optionally, the at least one projection includes a first projection and a second projection, and the sealing film covers upper surfaces of the first projection and the second projection, and a recess provided between the first projection and the second projection (a second configuration). The second configuration achieves further increase in contact area at the end portion of the sealing film to inhibit separation of the sealing film more effectively, in comparison to a configuration including the sealing film covering a single projection.

The first projection and the second projection in the second configuration optionally each have a linear portion having a substantially linear shape and disposed substantially in parallel with each other (a third configuration). In the third configuration, the end portion of the sealing film having a substantially linear shape covers the upper surfaces of the linear portions having the substantially linear shape, of the first projection and the second projection, and the recess provided between the first projection and the second projection. This configuration thus effectively inhibits separation at the entire end portion of the sealing film.

The at least one projection in the third configuration optionally further includes at least one third projection provided between the linear portion of the first projection and the linear portion of the second projection (a fourth configuration). The sealing film in the fourth configuration also covers the third projection to achieve further increase in contact area at the end portion of the sealing film. This configuration further improves the effect of preventing separation of the sealing film.

Optionally, the at least one third projection in the fourth configuration is shaped to connect the linear portion of the first projection and the linear portion of the second projection, and includes a plurality of third projections (a fifth configuration). The sealing film in the fifth configuration further covers the recess formed by the first projection, the second projection, and the third projections to achieve further increase in contact area at the end portion of the sealing film. This configuration further improves the effect of preventing separation of the sealing film.

Optionally, the at least one third projection in the fourth configuration has a pillar shape and includes a plurality of third projections (a sixth configuration). The sealing film in the sixth configuration also covers the plurality of third projections to achieve further increase in contact area at the end portion of the sealing film. This configuration further improves the effect of preventing separation of the sealing film.

Optionally, the projection in any one of the first to third configurations is provided outside the organic EL layer and has a frame shape to surround the organic EL layer with no gap (a seventh configuration). The sealing film in the seventh configuration covers the organic EL layer including a luminescent layer with no gap. This configuration effectively prevents entry of moisture, oxygen, and the like into the organic EL layer.

In the third configuration, optionally, the linear portion of the first projection and the linear portion of the second projection are each provided with a plurality of slits, and the slits in the linear portion of the first projection are positioned not to be superimposed on the slits in the linear portion of the second projection in a direction perpendicular to the linear portion of the first projection (an eighth configuration). In the eighth configuration, the linear portion of the first projection and the linear portion of the second projection are each provided with the slit. This configuration also inhibits separation of the sealing film.

Embodiments

Embodiments of the present invention will now be described in detail below with reference to the drawings. Identical or corresponding portions in the drawings will be denoted by identical reference signs and will not be described repeatedly. For clearer description, the drawings to be referred to hereinafter may depict simplified or schematic configurations or may not depict some of constituent members. The constituent members in each of the drawings may not necessarily be depicted at actual dimensional ratios.

An organic EL device includes an organic EL element, and examples of the organic EL device include an organic EL display device and an organic EL lighting device. Each of the following embodiments relates to an organic EL display device exemplifying the organic EL device.

First Embodiment

FIG. 1 is a schematic sectional view of an organic EL display device according to the present embodiment. The organic EL display device according to the present embodiment includes a TFT substrate 1, a base layer 2, a thin film transistor (TFT) 3, an interlayer insulating film 4, a first electrode 5, an organic EL layer 6, a second electrode 7, an edge cover 8, a first sealing film 9, and a second sealing film 10.

Examples of the TFT substrate 1 include a glass substrate and a flexible substrate made of polyimide or the like.

The base layer 2 is provided to improve adhesiveness of the first sealing film 9 and the second sealing film 10. In comparison to a configuration not including the base layer 2, a configuration including the base layer 2 has higher adhesiveness at an interface between the TFT substrate 1 and the sealing film (the first sealing film 9 and the second sealing film 10) to achieve a higher sealing property. Furthermore, the base layer 2 prevents entry of moisture, oxygen, and the like into the substrate provided with the organic EL layer 6 and the like from the TFT substrate 1.

The base layer 2 has a surface provided with a first projection 11 and a second projection 12 each projecting upward. There is provided a recess 13 between the first projection 11 and the second projection 12. The first projection 11, the second projection 12, and the recess 13 prevent separation at an end portion of the second sealing film 10, as to be described later.

The base layer 2 is, however, not an essential constituent member, and the organic EL display device according to the present embodiment is optionally provided with no base layer 2. In such a case where the base layer 2 is not provided, the TFT substrate 1 is provided thereon with the first projection 11 and the second projection 12.

There is provided a plurality of first electrodes 5 arrayed in a matrix form at predetermined intervals. Each of the first electrodes 5 configures a single pixel region of the organic EL display device.

The first electrodes 5 are provided thereon with the organic EL layer 6 that is provided thereon with the second electrode 7. The first electrode 5, the organic EL layer 6, and the second electrode 7 configure an organic EL element.

The TFT 3 functions as a switching element configured to control light emission of the organic EL element in each of colors of red (R), green (G), and blue (B).

The edge cover 8 covers end portions of the first electrodes 5. The edge cover 8 serves as an insulating layer preventing a short circuit between the first electrodes 5 and the second electrode 7 due to thinning of the organic EL layer 6 or electric field concentration at the end portions of the first electrodes 5. The edge cover 8 has openings exposing the first electrodes 5. These portions each serve as a luminous region of the organic EL element configuring each pixel.

Either the first electrodes 5 or the second electrode 7 functions as an anode, whereas the other functions as a cathode. In a case where the first electrodes 5 function as anodes and the second electrode 7 functions as a cathode, the first electrodes 5 configure a layer allowing hole injection (supply) to the organic EL layer 6, and the second electrode 7 configures a layer allowing electron injection to the organic EL layer 6. In this case, the organic EL layer 6 includes a hole injection layer, a hole transport layer, a luminescent layer, an electron transport layer, and an electron injection layer stacked in the mentioned order on the first electrodes 5.

The hole injection layer has a function of improving efficiency of hole injection to the organic EL layer 6.

The hole transport layer has a function of improving efficiency of hole transport to the luminescent layer.

The luminescent layer has a function of causing recombination between holes injected from the first electrodes 5 and electrons injected from the second electrode 7 to emit light in one of red, green, and blue colors. The luminescent layer can alternatively be configured to emit white light by combining red light, green light, and blue light.

The electron transport layer has a function of improving efficiency of electron transport from the second electrode 7 to the luminescent layer.

The electron injection layer has a function of improving efficiency of electron injection from the second electrode 7 to the organic EL layer 6.

Any one of the layers configuring the organic EL layer 6 can alternatively have two or more functions (e.g. functioning as a hole injection layer and a hole transport layer). The organic EL layer 6 can optionally include any other layer such as a carrier blocking layer, as necessary. For example, a hole blocking layer, which is additionally provided between the luminescent layer and the electron transport layer and functions as the carrier blocking layer, will inhibit holes from reaching the electron transport layer to improve luminous efficiency.

The above description assumes that the first electrodes 5 function as anodes and the second electrode 7 functions as a cathode. Alternatively, the first electrodes 5 can function as cathodes and the second electrode 7 can function as an anode. In the latter case, the layers configuring the organic EL layer 6 are stacked in a reverse order.

In a case where the above configuration includes the first electrodes 5 provided as transparent electrodes or translucent electrodes and the second electrode 7 provided as a reflective electrode, the organic EL display device is of a bottom emission type configured to emit light from the TFT substrate 1. In another case where the above configuration includes the second electrode 7 provided as a transparent electrode or a translucent electrode and the first electrodes 5 provided as reflective electrodes, the organic EL display device is of a top emission type configured to emit light from the second sealing film 10. The organic EL display device according to the present embodiment can be of any one of the bottom emission type and the top emission type.

The organic EL layer 6 and the second electrode 7 are covered with the first sealing film 9, and the outer surface of the first sealing film 9 is covered with the second sealing film 10. The first sealing film 9 and the second sealing film 10 are provided to prevent deterioration of the organic EL element by moisture and oxygen entering from outside. In particular, the second sealing film 10 covering the outer surface of the first sealing film 9 covers the end portion of the first sealing film 9. This configuration effectively prevents entry of moisture, oxygen, and the like from the end portion of the sealing film in comparison to a configuration provided only with a single sealing film.

The first sealing film 9 and the second sealing film 10 can be each provided as an inorganic film made of an inorganic material, or an organic film made of an organic material. The sealing film provided as an inorganic film can be made of silicon nitride, silicon oxide, silicon oxynitride, aluminum oxide ($Al_2O_3$), or the like. The sealing film provided as an organic film can be made of silicon oxycarbide (SiOC), acrylate, polyurea, parylene, polyimide, polyamide, or the like. As to be described later, the second sealing film 10 covers the first projection 11, the second projection 12, and the recess 13 on the base layer 2, and is thus preferably provided as a film having excellent step coverage (such as an organic film).

The first sealing film 9 and the second sealing film 10 can be formed in accordance with a known method such as the chemical vapor deposition (CVD) method, the sputtering method, or the atomic layer deposition (ALD) method. The CVD method and the ALD method are particularly preferred to exert excellent coverage upon film formation, on the first projection 11 and the second projection 12 on the TFT substrate 1.

The second sealing film 10 is provided to cover at least the recess 13. FIG. 1 exemplarily depicts the second sealing film 10 covering the first projection 11, the recess 13, and the second projection 12. This configuration achieves increase in contact area at the end portion of the second sealing film 10 to inhibit film separation, in comparison to a configuration provided with none of the first projection 11, the second projection 12, and the recess 13.

FIG. 1 exemplarily depicts a state where only the second sealing film 10 covers the recess 13. Alternatively, both the first sealing film 9 and the second sealing film 10 can cover the recess 13.

Figure 2A:
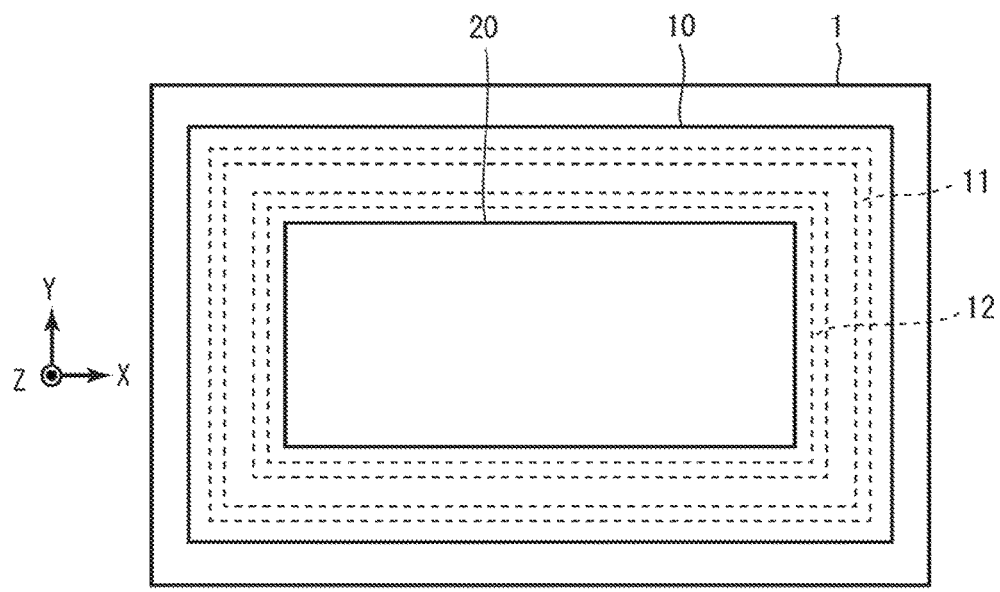
FIG. 2A is a top view of a TFT substrate provided thereon with a second sealing film, in the organic EL display device according to the first embodiment.
Figure 2B:
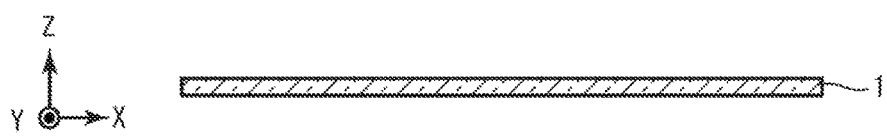
FIG. 2B is a side view of the TFT substrate.
Figure 2C:
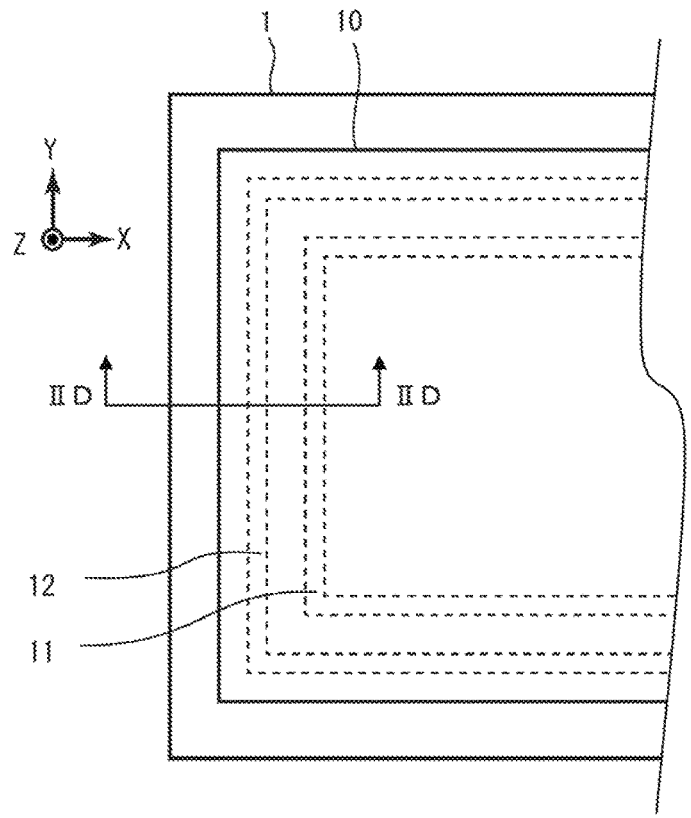
FIG. 2C is an enlarged view of a left end portion of the TFT substrate depicted in FIG. 2A.
Figure 2D:
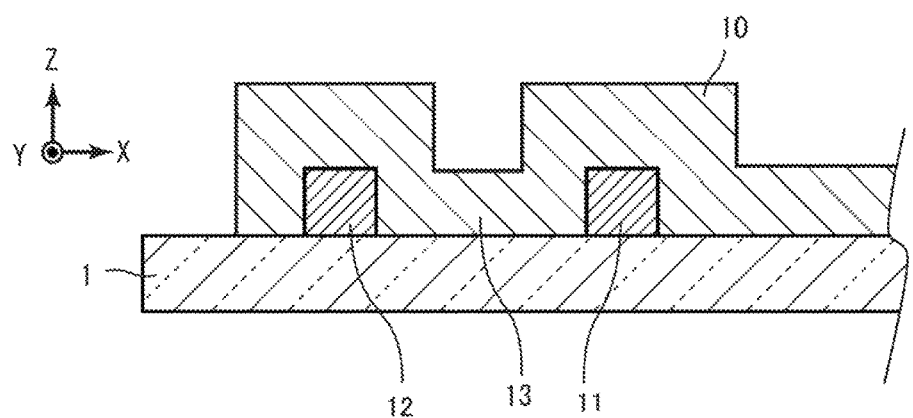
FIG. 2D is a sectional view taken along line IID-IID indicated in FIG. 2C.

Further description will be provided hereinafter with reference to the drawings depicting a configuration not including the base layer 2. FIGS. 2A to 2D are explanatory views depicting positional relations among the first projection 11, the second projection 12, and the recess 13 provided on the TFT substrate 1, and the second sealing film 10. FIG. 2A is a top view of the TFT substrate 1 provided thereon with the second sealing film 10, FIG. 2B is a side view of the TFT substrate 1, FIG. 2C is an enlarged view of an end portion of the TFT substrate 1, and FIG. 2D is a sectional view taken along line IID-IID indicated in FIG. 2C.

The TFT substrate 1 has an upper surface region including a display region and a non-display region. The display region is provided with pixels in a matrix form each configured to emit light in red (R), green (G), blue (B), or the like. The first projection 11 and the second projection 12 each have a frame shape to surround, with no gap, the organic EL layer 6 including the luminescent layer, in other words, the display region.

As depicted in the top view of FIG. 2A, the first projection 11 and the second projection 12 are similar in shape to the TFT substrate 1 having a rectangular shape. FIG. 2A exemplarily depicts the first projection 11 and the second projection 12 having the rectangular frame shape and adjacent sides connected with each other to surround a display region 20. The adjacent sides are not necessarily connected with each other.

Alternatively, the first projection 11 and the second projection 12 can be provided correspondingly only to appropriate three sides out of the four sides of the TFT substrate 1, can be provided correspondingly only to appropriate two sides thereof, or can be provided correspondingly only to an appropriate single side thereof. The first projection 11 and the second projection 12 are preferably provided correspondingly to the four sides in order to prevent separation of the second sealing film 10.

The first projection 11 and the second projection 12 can be formed by mask deposition upon formation of the second electrode 7. The production process of the organic EL display device can be shortened by forming the first projection 11 and the second projection 12 simultaneously with the second electrode 7.

FIG. 2C is an enlarged view of the left end portion of the configuration depicted in FIG. 2A.

As depicted in FIG. 2C, the first projection 11 and the second projection 12 have portions that are provided correspondingly to the left side of the TFT substrate 1, have a predetermined width in an X-axis direction, and extend in a Y-axis direction to have a substantially linear shape. As depicted in FIG. 2D, these portions have a predetermined height in a Z-axis direction to have a pillar shape.

Although not depicted, the first projection 11 and the second projection 12 have portions that are provided correspondingly to the right side of the TFT substrate 1. These portions also have a predetermined height in the Z-axis direction and a predetermined width in the X-axis direction, and extend in the Y-axis direction to have a pillar shape. The first projection 11 and the second projection 12 further have portions that are provided correspondingly to the upper side and the lower side of the TFT substrate 1. These portions have a predetermined height in the Z-axis direction and a predetermined width in the Y-axis direction, and extend in the X-axis direction to have a pillar shape.

As apparent from FIGS. 2C and 2D, the first projection 11 and the second projection 12 have a quadrangular prism shape. The first projection 11 and the second projection 12 are, however, not limited to the quadrangular prism shape but can alternatively have a triangular prism shape, a semi-cylindrical shape, or the like.

According to the present embodiment, even in a case where the second sealing film 10 receives stress, the first projection 11, the second projection 12, and the recess 13 provided on the base layer 2 (the TFT substrate 1 in a configuration not provided with the base layer 2) hold the second sealing film 10 to inhibit film separation. This configuration inhibits separation of the second sealing film 10 even in a case where the second sealing film 10 is thickened to have high membrane stress.

Separation of the second sealing film 10 can be inhibited even in a case where the organic EL display device according to the present embodiment is configured as a flexible display including a flexible substrate and folded. This configuration achieves a higher sealing property of the sealing film and inhibits entry of external moisture, oxygen, and the like into the organic EL element, to achieve improvement in reliability of the organic EL display device.

Second Embodiment

An organic EL display device according to the second embodiment differs from the organic EL display device according to the first embodiment, in shapes of projections provided on the base layer 2 (the TFT substrate 1 in a configuration not provided with the base layer 2).

Figure 3A:
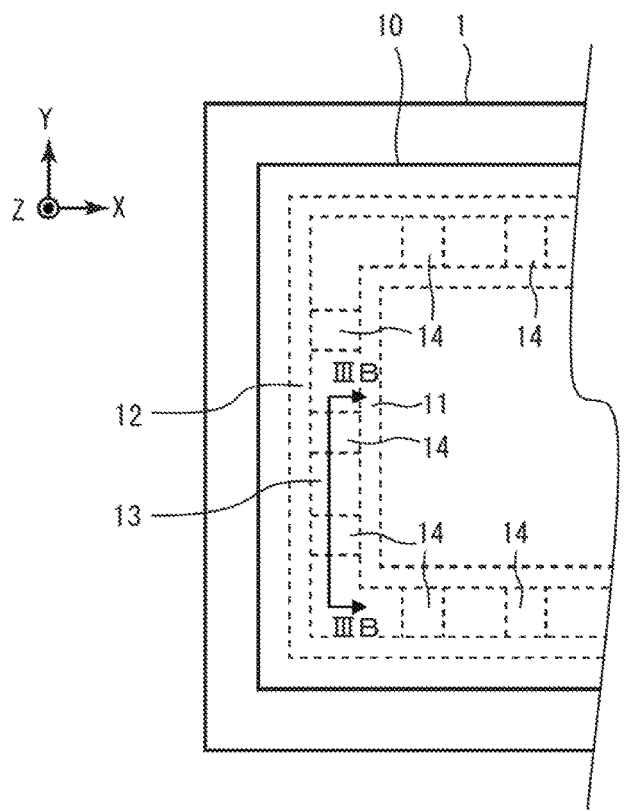
FIG. 3A is an explanatory view depicting shapes of projections provided on a TFT substrate in an organic EL display device according to a second embodiment, in an enlarged left end portion of the TFT substrate with a second sealing film provided on the projections.
Figure 3B:
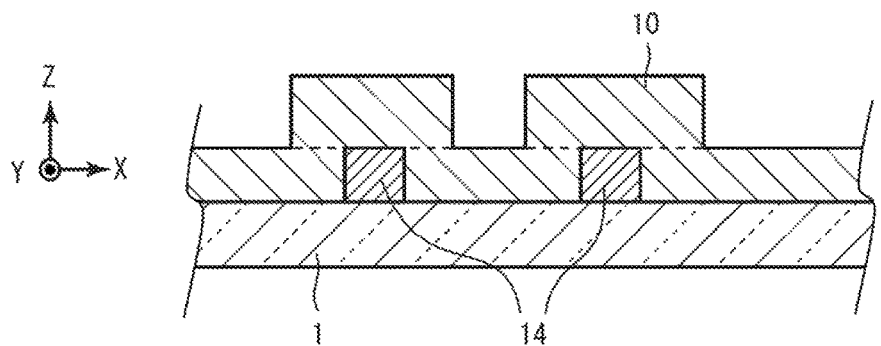
FIG. 3B is a sectional view taken along line IIIB-IIIB indicated in FIG. 3A.

Further description will be provided hereinafter with reference to the drawings depicting a configuration not including the base layer 2. FIGS. 3A and 3B are explanatory views depicting the shapes of the projections provided on the TFT substrate 1 in the organic EL display device according to the second embodiment. FIG. 3A is an enlarged view of a left end portion of the TFT substrate 1 provided thereon with the second sealing film 10. FIG. 3B is a sectional view taken along line IIIB-IIIB indicated in FIG. 3A.

Similarly to the first embodiment, the first projection 11 and the second projection 12 according to the present embodiment are provided correspondingly to and in parallel with the left side of the TFT substrate 1. There is further provided a plurality of third projections 14 connecting the first projection 11 and the second projection 12 provided in parallel with each other. Specifically, the TFT substrate 1 is provided with a projection having a ladder shape configured by the first projection 11, the second projection 12, and the third projections 14. There is also provided the recess 13 in each region surrounded with the first projection 11, the second projection 12, and the third projections 14.

The ladder-shaped projection is provided correspondingly to the left side of the TFT substrate 1 as well as to the right side, the upper side, and the lower side thereof. Alternatively, the ladder-shaped projection can be provided correspondingly only to appropriate three sides out of the four sides of the TFT substrate 1, can be provided correspondingly only to appropriate two sides thereof, or can be provided correspondingly only to an appropriate single side thereof. The ladder-shaped projection and the recesses formed by the projection are preferably provided correspondingly to the four sides in order to prevent separation of the second sealing film 10.

Still alternatively, the ladder-shaped projection can be provided correspondingly to at least one of the four sides of the TFT substrate 1, and the first projection 11 and the second projection 12 according to the first embodiment can be provided correspondingly to the remaining sides.

The second sealing film 10 according to the present embodiment covers the third projections 14 in addition to the first projection 11 and the second projection 12, in other words, more projections than the projections in the configuration according to the first embodiment. This configuration achieves increase in contact area at the end portion of the second sealing film 10 to further improve the effect of preventing separation of the second sealing film 10.

Third Embodiment

An organic EL display device according to the third embodiment differs from the organic EL display devices according to the first and second embodiments, in shapes of projections provided on the base layer 2 (the TFT substrate 1 in a configuration not provided with the base layer 2).

Figure 4A:
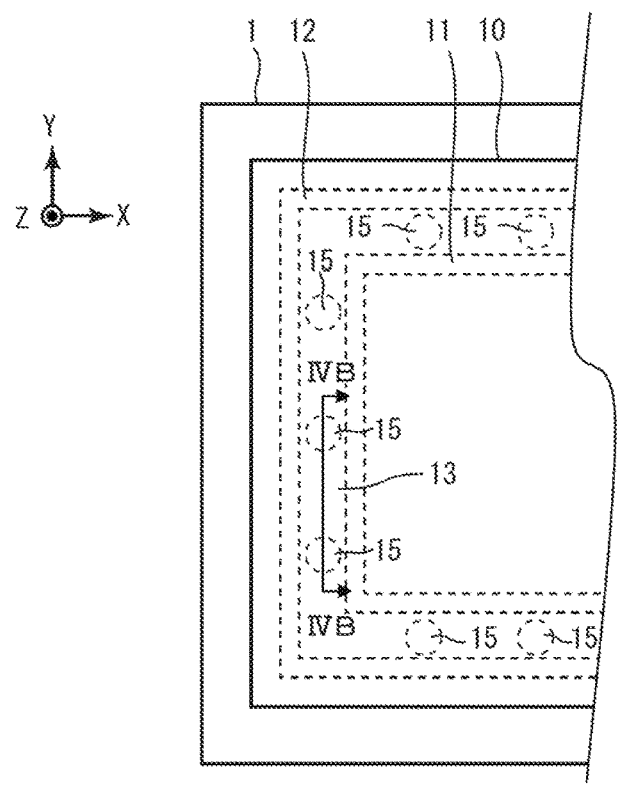
FIG. 4A is an explanatory view depicting shapes of projections provided on a TFT substrate in an organic EL display device according to a third embodiment, in an enlarged left end portion of the TFT substrate with a second sealing film provided on the projections.
Figure 4B:
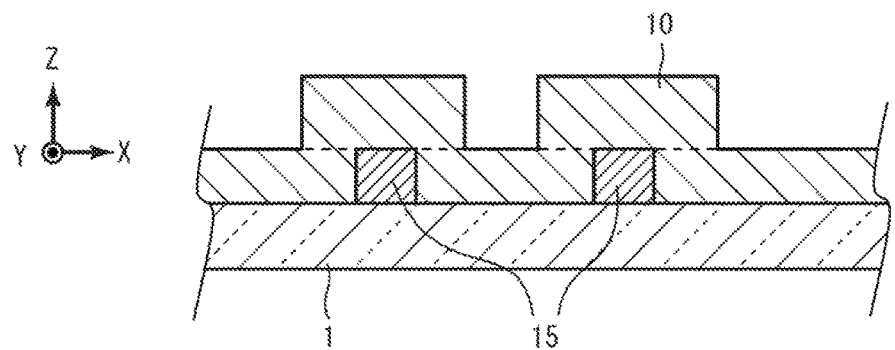
FIG. 4B is a sectional view taken along line IVB-IVB indicated in FIG. 4A.

Further description will be provided hereinafter with reference to the drawings depicting a configuration not including the base layer 2. FIGS. 4A and 4B are explanatory views depicting the shapes of the projections provided on the TFT substrate 1 in the organic EL display device according to the third embodiment. FIG. 4A is an enlarged view of a left end portion of the TFT substrate 1 provided thereon with the second sealing film 10. FIG. 4B is a sectional view taken along line IVB-IVB indicated in FIG. 4A.

Similarly to the first embodiment, the first projection 11 and the second projection 12 according to the present embodiment are provided correspondingly to and in parallel with the left side of the TFT substrate 1. There is further provided, between the first projection 11 and the second projection 12 in parallel with each other, a plurality of third projections 15 having a cylindrical shape, at predetermined intervals along the first projection 11 and the second projection 12 each having the substantially linear shape. There has only to be provided at least one third projection 15. Furthermore, the third projections 15 can have a pillar shape such as a triangular prism shape or a quadrangular prism shape, other than the cylindrical shape.

The projections configured similarly are provided correspondingly to the right side, the upper side, and the lower side of the TFT substrate 1 in addition to the left side thereof. Alternatively, the first projection 11, the second projection 12, and the third projections 15 can be provided correspondingly only to appropriate three sides out of the four sides of the TFT substrate 1, can be provided correspondingly only to appropriate two sides thereof, or can be provided correspondingly only to an appropriate single side thereof. The first projection 11, the second projection 12, and the third projections 15 are preferably provided correspondingly to the four sides in order to prevent separation of the second sealing film 10.

Still alternatively, the first projection 11, the second projection 12, and the third projections 15 according to the present embodiment can be provided correspondingly to at least one of the four sides of the TFT substrate 1, and the projections according to the first or second embodiment can be provided correspondingly to the remaining sides.

The second sealing film 10 according to the present embodiment covers the third projections 15 having the cylindrical shape, in addition to the first projection 11 and the second projection 12, in other words, more projections than the projections in the configuration according to the first embodiment. This configuration achieves increase in contact area at the end portion of the second sealing film 10 to further improve the effect of preventing separation of the second sealing film 10.

Fourth Embodiment

An organic EL display device according to the fourth embodiment differs from the organic EL display devices according to the first to third embodiments, in shapes of projections provided on the base layer 2 (the TFT substrate 1 in a configuration not provided with the base layer 2).

Figure 5:
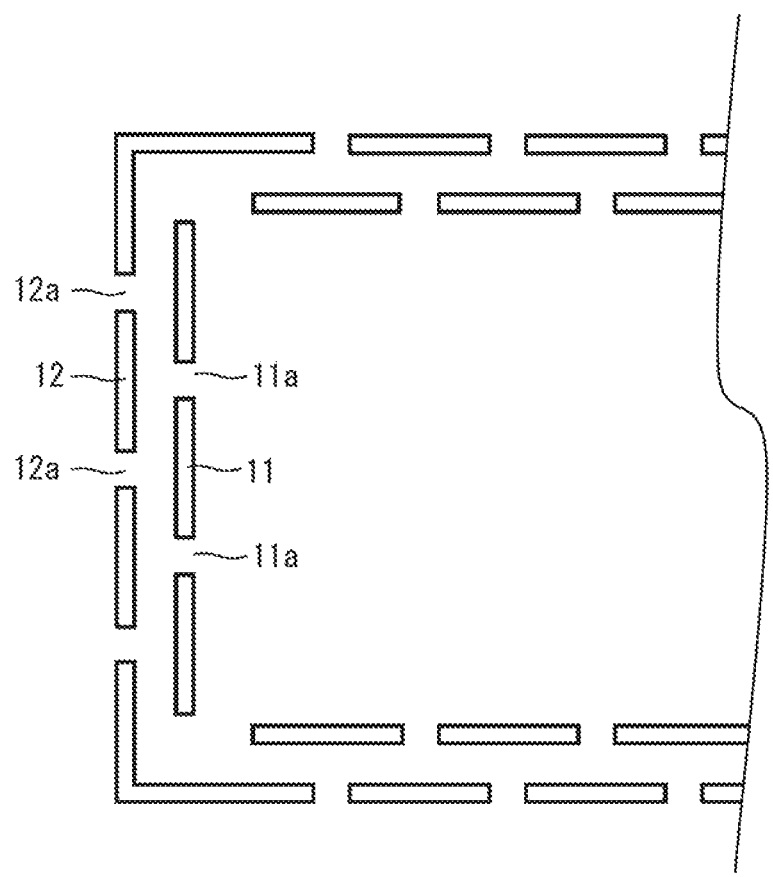
FIG. 5 is an explanatory view depicting shapes of projections provided on a TFT substrate in an organic EL display device according to a fourth embodiment.

FIG. 5 is an explanatory view depicting the shapes of the projections provided on the TFT substrate 1 in the organic EL display device according to the fourth embodiment. Similarly to the first embodiment, the first projection 11 and the second projection 12 according to the present embodiment are provided correspondingly to and in parallel with the left side of the TFT substrate 1. The first projection 11 is provided with a plurality of slits 11a, whereas the second projection 12 is provided with a plurality of slits 12a.

The slits 11a of the first projection 11 are positioned to be superimposed on the second projection 12 in an outward direction of the TFT substrate 1. The slits 12a of the second projection 12 are positioned to be superimposed on the first projection 11 in an inward direction of the TFT substrate 1. In other words, the slits 11a provided in the linear portion of the first projection 11 are positioned not to be superimposed on the slits 12a provided in the linear portion of the second projection 12 in a direction perpendicular to the linear portion of the first projection 11 (in the outward direction of the TFT substrate 1).

The projections configured similarly are provided correspondingly to the right side, the upper side, and the lower side of the TFT substrate 1 in addition to the left side thereof. Alternatively, the first projection 11 and the second projection 12 each having the slits can be provided correspondingly only to appropriate three sides out of the four sides of the TFT substrate 1, can be provided correspondingly only to appropriate two sides thereof, or can be provided correspondingly only to an appropriate single side thereof. The first projection 11 and the second projection 12 are preferably provided correspondingly to the four sides in order to prevent separation of the second sealing film 10.

Still alternatively, the first projection 11 and the second projection 12 according to the present embodiment can be provided correspondingly to at least one of the four sides of the TFT substrate 1, and the projections according to any one of the first to third embodiments can be provided correspondingly to the remaining sides.

Furthermore, the first projection 11 and the second projection 12 may not necessarily have the plurality of slits but can alternatively have only one slit.

Figure 6:
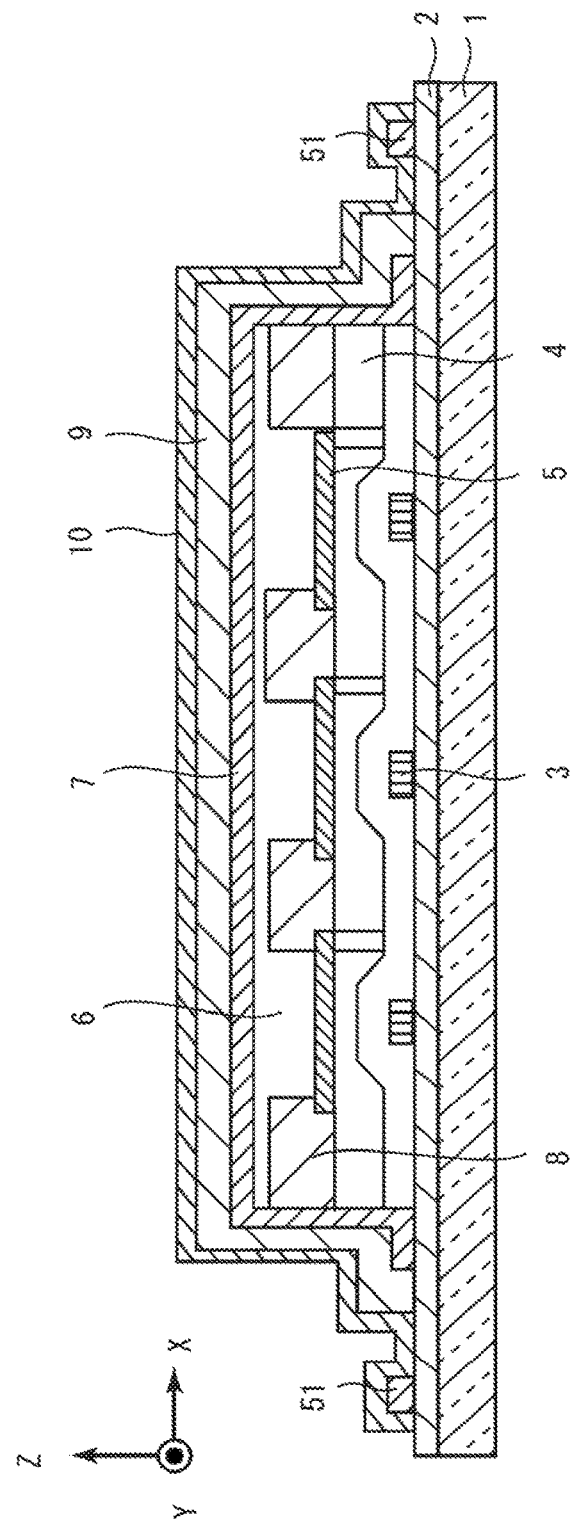
FIG. 6 is a schematic sectional view depicting a configuration of an organic EL display device including a TFT substrate provided with a single projection.

The present invention should not be limited to the embodiments described above. For example, the TFT substrate 1 (the base layer 2 in a configuration including the base layer 2) can be provided on the surface with only one projection. FIG. 6 is a schematic sectional view depicting a configuration of an organic EL display device including the base layer 2 provided with a single projection 51. The end portion of the second sealing film 10 covers the projection 51 in this case. This configuration also achieves increase in contact area at the end portion of the second sealing film 10 in comparison to a configuration not provided with the projection 51, to inhibit separation of the second sealing film 10. Both the first sealing film 9 and the second sealing film 10 can alternatively cover the single projection 51.

The organic EL device according to the present invention exerts the effect of preventing separation of the sealing film in a case where the TFT substrate 1 is provided thereon with at least one projection and the sealing film covers the at least one projection. The configuration expressed such that "the sealing film covers the projection" in the present application includes a configuration in which the sealing film covers the side surfaces and the entire upper surface of the projection, as well as a configuration in which the sealing film covers part of the side surfaces and the entire upper surface of the projection, and a configuration in which the projection covers part of the side surfaces and part of the upper surface of the projection.

The embodiments described above relate to the sealing films having a two-layer structure including the first sealing film 9 and the second sealing film 10. The present invention is applicable also to a stacked layer structure including three or more layers, as well as to a single layer structure.

The recess 13 provided between the first projection 11 and the second projection 12 may not have a flat bottom surface but can alternatively have a bottom surface curved at corners. Such curved corners exert better adhesiveness of the sealing film than right-angled corners, to further improve the effect of preventing separation of the sealing film.

The organic EL device according to the present invention is applicable to various organic EL display devices such as a television, a smartphone, a tablet terminal, and a game machine, organic EL lighting devices, and the like.

REFERENCE NUMERALS

1 TFT substrate
5 First electrode
6 Organic EL layer
7 Second electrode
9 First sealing film
10 Second sealing film
11 First projection
11a Slit
12a Slit
12 Second projection
13 Recess
14 Third projection
15 Third projection
51 Projection

The invention claimed is:
1. An organic EL device comprising:
a substrate;
a first electrode provided on the substrate;
an organic EL layer provided on the first electrode;
a second electrode provided on the organic EL layer; and
a sealing film covering the second electrode; wherein
the sealing film includes a first sealing film and a second sealing film, an outer surface of the first sealing film is covered with the second sealing film, the substrate is provided thereon with at least one upward projection, the second sealing film covers the projection, the at least one projection includes a first projection and a second projection, the sealing film covers upper surfaces of the first projection and the second projection, and a recess provided between the first projection and the second projection, the first projection and the second projection each have a linear portion having a substantially linear shape and disposed substantially in parallel with each other, the linear portion of the first projection and the linear portion of the second projection are each provided with a slit, and the slit in the linear portion of the first projection is positioned not to be superimposed on the slit in the linear portion of the second projection in a direction perpendicular to the linear portion of the first projection.

2. The organic EL device according to claim 1, wherein the first sealing film made of an organic material, and the second sealing film made of an inorganic material.

3. The organic EL device according to claim 1, further comprising a base layer, wherein the projection is formed on the base layer.

4. The organic EL device according to claim 1, wherein the linear portion of the first projection has a right-angle corner at a corner of the substrate, and the linear portion of the second projection has a slit at a corner of the substrate.

5. An organic EL device comprising:

a substrate;

a first electrode provided on the substrate;

an organic EL layer provided on the first electrode;

a second electrode provided on the organic EL layer; and a sealing film covering the second electrode; wherein the sealing film includes a first sealing film and a second sealing film, an outer surface of the first sealing film is covered with the second sealing film, the substrate is provided thereon with at least one upward projection, the second sealing film covers the projection, and the projection is formed outside the first sealing film.

6. The organic EL device according to claim 5, wherein the at least one projection includes a first projection and a second projection, and the sealing film covers upper surfaces of the first projection and the second projection, and a recess provided between the first projection and the second projection.

7. The organic EL device according to claim 6, wherein the first projection and the second projection each have a linear portion having a substantially linear shape and disposed substantially in parallel with each other.

8. The organic EL device according to claim 7, wherein the at least one projection further includes at least one third projection provided between the linear portion of the first projection and the linear portion of the second projection.

9. The organic EL device according to claim 8, wherein the at least one third projection is shaped to connect the linear portion of the first projection and the linear portion of the second projection, and includes a plurality of third projections.

10. The organic EL device according to claim 8, wherein the at least one third projection has a pillar shape and includes a plurality of third projections.

11. The organic EL device according to claim 5, wherein the projection is provided outside the organic EL layer and has a frame shape to surround the organic EL layer with no gap.

12. The organic EL device according to claim 5, wherein the first sealing film made of an organic material, and the second sealing film made of an inorganic material.

13. The organic EL device according to claim 5, further comprising a base layer, wherein the projection is formed on the base layer.

14. The organic EL device according to claim 9, wherein an aperture is provided between two adjacent projections among the plurality of the third projections.

15. The organic EL device according to claim 5, wherein the linear portion of the first projection has a right-angle corner at a corner of the substrate, and the linear portion of the second projection has a slit at a corner of the substrate.

16. An organic EL device comprising:

a substrate;

a first electrode provided on the substrate;

an organic EL layer provided on the first electrode;

a second electrode provided on the organic EL layer; and a sealing film covering the second electrode; wherein the sealing film includes a first sealing film and a second sealing film, an outer surface of the first sealing film is covered with the second sealing film, the substrate is provided thereon with at least one upward projection, the second sealing film covers the projection, the at least one projection includes a first projection and a second projection, the sealing film covers upper surfaces of the first projection and the second projection, and a recess provided between the first projection and the second projection, the first projection and the second projection each have a linear portion having a substantially linear shape and disposed substantially in parallel with each other, the at least one projection further includes at least one third projection provided between the linear portion of the first projection and the linear portion of the second projection, the at least one third projection is shaped to connect the linear portion of the first projection and the linear portion of the second projection, and includes a plurality of third projections, and an aperture is provided between two adjacent projections among the plurality of the third projections.

17. The organic EL device according to claim 16, wherein the at least one third projection has a pillar shape and includes a plurality of third projections.

18. The organic EL device according to claim 16, wherein the projection is provided outside the organic EL layer and has a frame shape to surround the organic EL layer with no gap.

19. The organic EL device according to claim 16, wherein the first sealing film made of an organic material, and the second sealing film made of an inorganic material.

20. The organic EL device according to claim 16, further comprising a base layer, wherein the projection is formed on the base layer.

* * * * *